United States Patent [19]

Matthews

[11] Patent Number: 5,075,247

[45] Date of Patent: Dec. 24, 1991

[54] METHOD OF MAKING HALL EFFECT SEMICONDUCTOR MEMORY CELL

[75] Inventor: James A. Matthews, Milpitas, Calif.

[73] Assignee: MicroUnity Systems Engineering, Inc., Palo Alto, Calif.

[21] Appl. No.: 640,061

[22] Filed: Jan. 11, 1991

Related U.S. Application Data

[62] Division of Ser. No. 466,787, Jan. 18, 1990.

[51] Int. Cl.$^5$ .................. H01L 21/78; H01L 21/27
[52] U.S. Cl. ............................ 437/52; 437/48; 365/170; 365/171
[58] Field of Search ............... 437/52, 43, 48; 357/24; 365/9, 170, 171, 145, 177, 5

[56] References Cited

U.S. PATENT DOCUMENTS

| | | |
|---|---|---|
| 3,820,091 | 6/1974 | Kohara ................................. 365/5 |
| 3,835,376 | 9/1974 | Kataoka ................................ 365/9 |
| 3,858,232 | 12/1974 | Boyle et al. ......................... 357/24 |
| 4,276,616 | 6/1981 | Hennig ............................... 365/177 |
| 4,516,144 | 9/1982 | Jaskolski et al. . | |

FOREIGN PATENT DOCUMENTS

2148365 5/1985 United Kingdom ............... 365/171

*Primary Examiner*—Olik Chaudhuri
*Assistant Examiner*—Loc Q. Trinh

[57] ABSTRACT

A non-volatile, static magnetic memory device, whose operation is based on the Hall effect, is disclosed. The device includes a magnetic patch which stores data in the form of a magnetic field, a semiconductor Hall bar and a pair of integrally-formed bipolar transistors used for amplifying and buffering the Hall voltage produced along the Hall bar. Current is forced to flow down the length of the Hall bar causing a Hall voltage to be developed in a direction transverse to the direction of both the magnetic field and the current. The bases of the bipolar transistors are ohmically coupled to the Hall bar to sense the Hall voltage—the polarity of which is representative of the stored information. A system of current carrying conductors is employed for writing data to individual magnetic patches.

9 Claims, 7 Drawing Sheets

FIG_1

FIG_2

FIG_3

FIG_4

FIG_5

FIG_6

FIG_8 SINGLE ENDED CELL

FIG_9 DIFFENTIAL CELL WITH SHARED BIT LINES

FIG_10

METHOD OF MAKING HALL EFFECT SEMICONDUCTOR MEMORY CELL

CROSS REFERENCE TO RELATED APPLICATIONS

This is a division of Ser. No. 07/466,787, filed Jan. 18, 1990.

FIELD OF THE INVENTION

This invention relates to the field of magnetic semiconductor memory devices; most particularly, those devices which rely on the Hall effect wherein a transverse voltage is developed across a conductor carrying a current in the presence of a magnetic field.

BACKGROUND OF THE INVENTION

When a magnetic field is applied to a conductor carrying a current, in a direction at right angles to the current, an electromotive force is produced across the conductor in a direction perpendicular to both the current and to the magnetic field. This effect, known as the Hall effect after E. H. Hall who discovered it in thin metallic foils in 1879, has become one of the most powerful tools for studying the electronic properties of semiconductors. As it is most commonly used today, the measurement of the Hall voltage enables a process engineer to determine the number of current carriers per unit volume within a semiconductor device, and also whether they are positively or negatively charged.

In the past, certain classes of semiconductor devices have utilized the Hall effect for particularized applications. For example, U.S. Pat. No. 4,516,144 discloses a magnetically sensitive semiconductor device used to sense crankshaft angle positions in automotive systems. In the operation of that device, carriers from an emitter region travel through a base region toward one or the other of a pair of spaced-apart collector regions. The carriers are deflected toward one or the other collector regions according to the polarity of a perpendicularly applied magnetic field. The strength and direction of the magnetic field is determined by the crankshaft angle position.

Despite previous attempts aimed at developing a viable semiconductor magnetic memory, the integration of a magnetic memory storage element and a semiconductor sensor device has thus far proven to be a formidable task. Applicant is unaware of the existence of any Hall effect magnetic semiconductor memory device which is feasible for use in today's very large scale integrated (VLSI) circuits and which meets the storage requirements of most modern computer systems.

The present invention combines a magnetic storage element with an integral solid-state sensor and/or amplifier to form a novel memory cell that is at once very small, static, non-volatile, and which provides high performance at a relatively low cost. As will be seen, data is stored in the form of magnetized patches or domains in a magnetic material placed in close proximity to a semiconductor sensor. In a preferred embodiment, the magnetic field is directed vertically through the semiconductor sensor to generate a transverse voltage in accordance with the Hall effect. In other implementations, multiple domains are produced within the patch to store analog data. The adaptability of the basic memory cell of the present invention is such that it lends itself to numerous embodiments and alternative methods of reading and writing information.

SUMMARY OF THE INVENTION

A non-volatile, static magnetic memory device, whose operation is based on the Hall effect, is disclosed. In one embodiment, the present invention includes a magnetic path which stores data in the form of a magnetic field and a Hall-effect sensor for reading the stored data from the magnetic patch.

Each sensor comprises a Hall bar and a detector means. As current is made to flow down the length of the Hall bar by an external means, a Hall voltage is developed across the Hall bar in a direction transverse to the direction of both the magnetic field and the current. The detector means is coupled to the Hall bar in such a way that it detects the Hall voltage, which itself is representative of the stored information. A magnetizing means is included for writing data or other information to each magnetic patch.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows,, read in conjunction with the accompanying drawings, wherein:

DESCRIPTION OF THE PREFERRED EMBODIMENTS

A novel magnetic semiconductor memory device which utilizes the Hall effect during read operations is described. In the following description numerous specific details are set forth, such as specific conductivity types, dimensions, material, etc., in order to provide a more thorough understanding of the present invention.

It will be obvious, however, to one skilled in the art that these specific details need not be used to practice the present invention. In other instances, other well-known structures and circuits have not been shown in detail in order to avoid unnecessarily obscuring the present invention.

Figure 1:
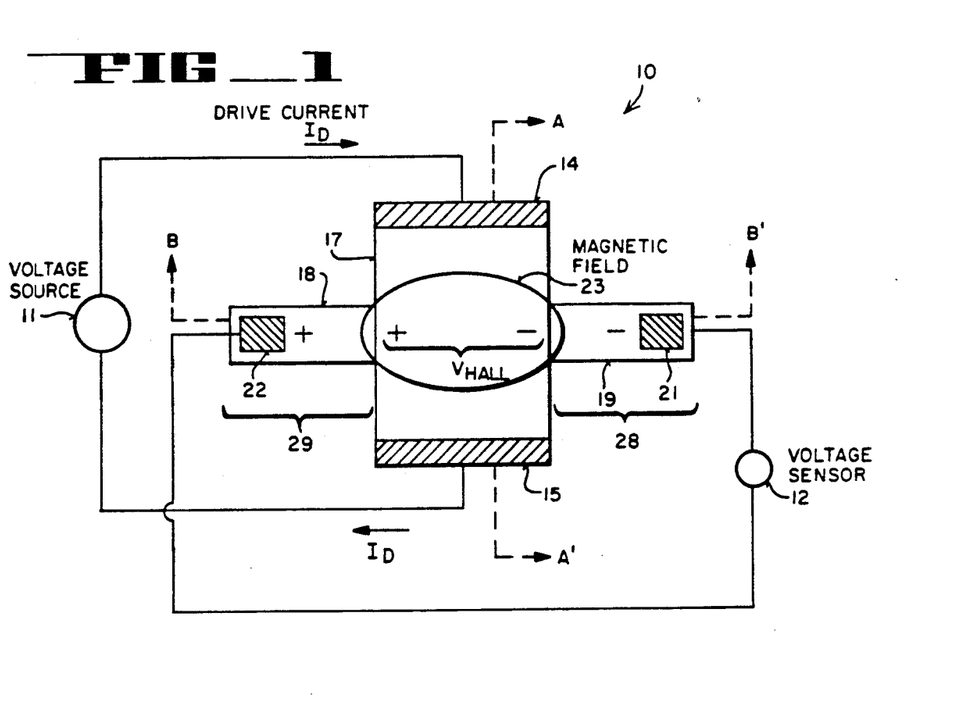
FIG. 1 illustrates the basic Hall sensor of the present invention.
Figure 2:
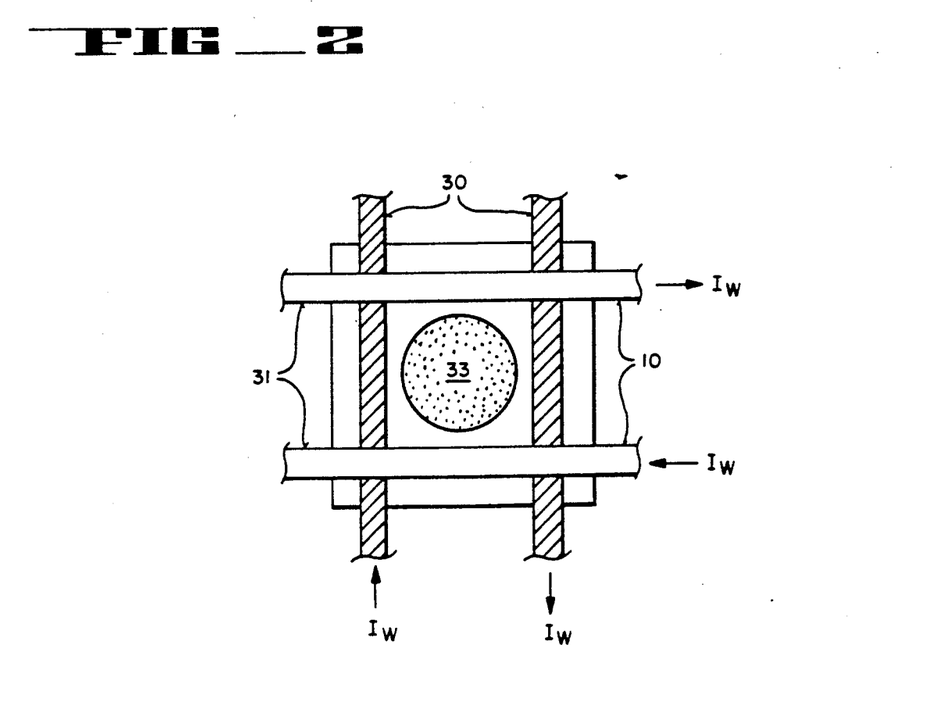
FIG. 2 illustrates the top view of the basic memory cell in which a magnetic patch is formed above a semiconductor Hall sensor. Also shown are the write lines used or magnetizing the patch.

There is shown in FIGS. 1 and 2 a magnetically-sensitive semiconductor memory device fabricated in a substrate material. The memory device includes a semiconductor sensor 10 and a magnetic patch 33 which is preferably formed directly above sensor 10. Magnetic patch 33 stores data in the form of a magnetic field. In the case of binary information, the magnetic field is oriented either up or down (e.g., either into or out of the page in FIGS. 1 and 2). When analog data is stored, multiple magnetic domains are formed in patch 33.

Detecting the polarity of the magnetic field, i.e., reading data stored in patch 33, is accomplished using sensor 10. When fabricated in an array, each memory cell comprises a sensor 10 and a magnetic patch 33, together with associated read and write lines. The operation of sensor 10 is based on the well-known Hall effect, whereby a transverse voltage, $V_{Hall}$, is developed across a conductor carrying a current in the presence of a magnetic field. The polarity of the Hall voltage is dependent on the direction of the current flow, the charge sign of the current carriers and the direction of the magnetic field. If the direction of the current flow and charge sign of the carriers is known, then the direction of the magnetic field is easily determined. Therefore, in sensing the polarity of $V_{Hall}$ the content of the memory cell is read. Of course, the content of patch 33 is actually the magnetic domain which represents the stored data. In the case of an analog memory, the magnitude and polarity of the Hall voltage is sensed when reading data.

In the simplest case of the Hall effect, current flow is generated through a semiconductor bar to obtain a voltage directed perpendicular to the length of the bar. Although the Hall sensor is ordinarily fabricated in a semiconductor substrate, it may comprise any material which expresses the Hall effect. Conceivably, it could comprise materials other than silicon as well. By way of example, the Hall sensor utilized in the presently invented memory cell may comprise a vacuum in which an electron beam is partially deflected to one side or the other. For certain high speed applications, an ideal Hall sensor is realized by a two-dimensional electron gas. Such a gas is commonly found near the metallurgical junction of many III-IV type heterostructures (e.g., GaAs/AlGaAs). Therefore, it is appreciated that the described Hall sensor may alternatively comprise many different structures and/or materials without departing from the spirit or scope of the present invention.

In the particular embodiment of FIGS. 1 and 2, sensor 10 comprises a semiconductor Hall bar fabricated in a silicon substrate. The drive current, $I_d$, enters the Hall bar at p+ drain region 14 and exits the bar at p+ source region 15. The spaced-apart regions 14 and 15 define a channel 17 therebetween. The combination of regions 14, 15, channel 17 and an overlying polysilicon gate (not shown in FIG. 1) form an ordinary p-channel metal-oxide-semiconductor (MOS) device. As is well understood, the application of a low potential (e.g., 0 Volts) to the control electrode of a p-channel MOS device causes an inversion layer to be generated directly below the substrate surface in channel 17. This inversion layer provides a conductive path for the drive current $I_d$ to flow. In the particular implementation of FIG. 1, external voltage source 11 generates drive current $I_d$.

Ideally, the Hall effect is most pronounced when the semiconductor Hall bar is fairly thin. A thin current carrying region means a higher current density which, in turn, produces a higher Hall voltage, $V_{Hall}$. A larger Hall voltage is generally desired for greater output and sensitivity. In this respect, about the thinnest current sheet ($\sim 100-200$ Å) that may be realized is an inversion layer. As the current $I_d$ flows along channel 17, the voltage $V_{Hall}$ appears in the thin inversion layer transverse to the direction of current flow. Obviously, this assumes the presence of a local magnetic field whose lines of flux are perpendicular to both $I_d$ and to $V_{Hall}$. The oval ring 23 in FIG. 1 denotes a magnetic field directed either into or out of the page. As previously mentioned, magnetic field 23 is produced by magnetic patch 33.

With continuing reference to FIG. 1, a key innovation of the presently invented magnetic memory cell is the integration of a pair of bipolar transistors into the Hall sensor as buffer amplifiers. These transistors are shown in FIG. 1 as transistors 28 and 29. The base-emitter regions of NPN transistor 28 are indicated by regions 19 and 21, respectively, while the base-emitter regions for the NPN transistor 29 (located on the opposite side of channel 17) are indicated by regions 18 and 22, respectively. The n-type substrate acts as a common collector for both transistors. As will be described further, the Hall voltage generated in the inversion layer of the MOS transistor becomes ohmically coupled to base regions 18 and 19. In this way, the voltage $V_{Hall}$ produces a difference potential across emitters 21 and 22, which is then detected by voltage sensor 12.

It is appreciated that each of the semiconductor regions of Hall sensor 10 may be fabricated using conventional bipolar process technology. Most desirable, however, is a process in which bipolar and MOS type devices are fabricated on the same substrate. These processes are often referred to as BiCMOS processes. In the currently preferred embodiment of the present invention, the BiCMOS process disclosed in the U.S. Pat. Application entitled "BiCMOS Process Utilizing Novel Planarization Technique," Ser. No. 07/463,290, Filed Jan. 10, 1990, is utilized to fabricate Hall sensor 10. The above application is assigned to the assignee of the present invention and is herein incorporated into this application by reference.

Referring, now to FIG. 2, the types of magnetic materials used in the topology of the present invention are preferably the same materials which are commonly used in the field of perpendicular magnetic recording. Typically, magnetic patch 33 comprises a cobalt-chromium (CoCr) alloy film which is deposited by one of several different methods. For instance, the magnetic film may be applied by sputtering evaporation, electroplating, etc. Each of these methods are compatible with modern semiconductor technology. It may also be feasible to deposit the magnetic material by the process of spincoating or sedimentation.

In the sedimentation process, a suspension of magnetic particles in a binder system is deposited over the wafer surface. The magnetic particles are then allowed to settle into holes which have been previously etched between write lines 30 and 31. The magnetic particles are properly oriented or aligned by applying a magnetic bias to the suspension as the binder cools or cures. This process is similar to that used to manufacture magnetic tape, except in this case the particles are oriented vertically rather than horizontally. Preferably, magnetic patch 33 is grain-oriented so that the magnetic field lines are arranged vertically (i.e. either into or out of the page in FIGS. 1 and 2) relative to sensor 10. Acceptable thicknesses generally lie in the range between 0.1 to 3.0 microns thick. Research indicates that a wide variety of magnetic materials satisfy the requirements of coercivity, remnant magnetization, and magnetic hardness for the memory cell of the present invention.

Realize that magnetic patch 33 is not limited to the circular shape depicted in FIG. 2. Instead, in other embodiments it may assume the shape of a square, rectangular or, even comprise a small portion of a continuous layer of magnetic material deposited over the wafer surface. The only critical requirement is that pitch 33 be electrically isolated from write lines 30 and 31 and from the active regions of semiconductor sensor 10.

Writing to the memory cell of FIG. 2 is achieved by forcing the magnetic particles in an individual patch 33 to assume a particular orientation or polarity. This is most easily accomplished by generating a localized magnetic field of sufficient strength to "flip" the polarity of patch 33 in the desired direction. In the preferred embodiment, a large write current, $I_W$, is directed along lines 30 and 31 to properly magnetize patch 33.

FIG. 2 illustrates a typical direction of $I_W$ along conductor lines 30 and 31 during a write cycle. Conductor lines 30 and 31 are normally fabricated from first and second layer metal (i.e., metal 1 and metal 2), respectively. The patterning of these lines is in accordance with well understood photolithographic techniques. The magnitude of the current $I_W$ which flows through write lines 30 and 31 is usually on the order of 10 milliamps for a patch which is approximately one square micron in dimension. The resulting magnetic field produced in patch 33 gives rise to a Hall voltage which is on the order of about one Volt.

Figure 3:
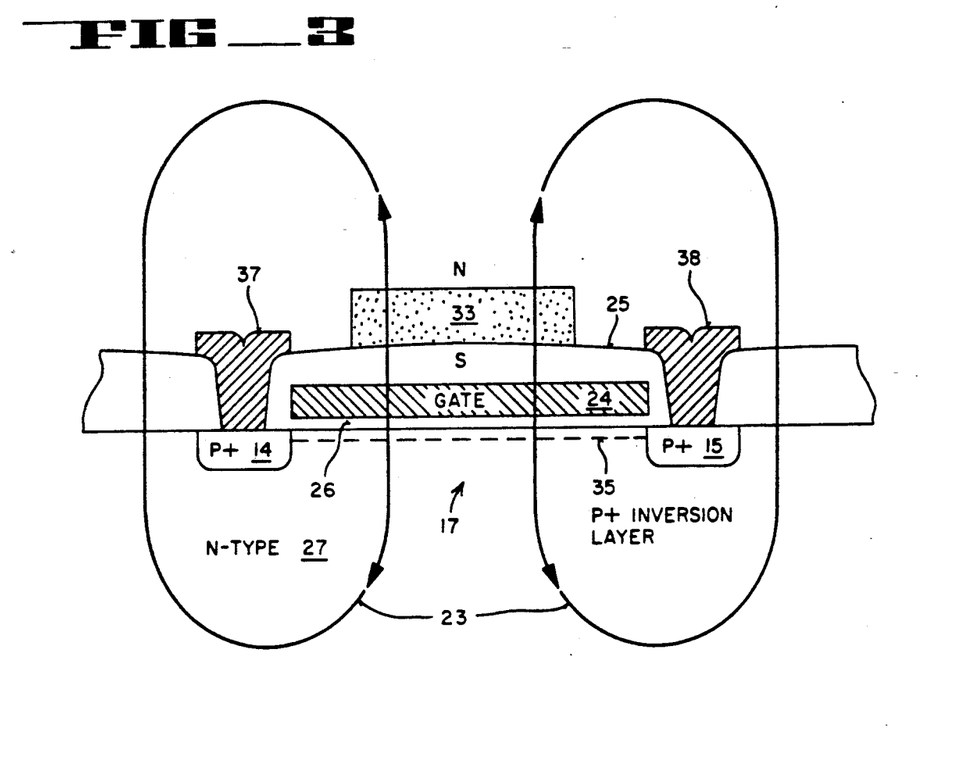
FIG. 3 is a cross sectional view of the currently preferred embodiment of FIG. 1 along lines A—A'.

With reference to FIG. 3, a cross sectional view of the magnetic memory cell of FIG. 1 is illustrated. The view of FIG. 3 is taken along the cut line labeled A—A'. Spaced-apart p+ regions 14 and 15 are shown fabricated in an n-type substrate 27. Regions 14 and 15 are fabricated using either ordinary diffusion or ion implantation techniques. A polysilicon gate 24 is formed directly above the channel 17. Gate 24 is insulated from substrate 27 by the gate oxide 26 below, and from magnetic patch 33 by a dielectric insulation layer 25 above. Ohmic contact to regions 14 and 15 is provided by members 37 and 38, respectively. According to the preferred BiCMOS process, members 37 and 38 comprise doped polysilicon; however, ordinary metal, or other conductive materials, may also be used.

During normal read operations of the memory cell of FIG. 3 polysilicon gate number 24 is grounded to create a p+ inversion layer 35 in channel 17 of the sensor. Once inversion layer 35 has been formed, the drive current $I_d$ may flow between source/drain regions 14 and 15. The voltage, $V_{Hall}$, is produced across layer 35 (directed either into or out of the page) in response to magnetic field 23. FIG. 3 also shows patch 33 patterned on top of layer 25 and magnetically-oriented so that its south pole is nearest to gate 24. This results in a magnetic field whose lines of flux are shown by arrows 23 in FIG. 3.

Figure 4:
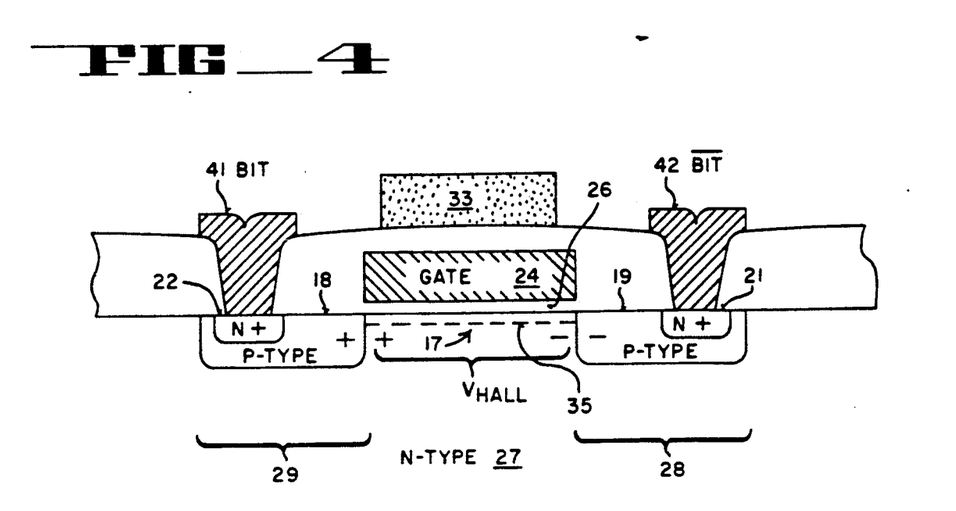
FIG. 4 shows a cross sectional view of the currently preferred embodiment of FIG. 1 along the lines B—B'.

In FIG. 4 a cross-sectional view of the magnetic memory cell of FIG. 1 is shown along cut lines B—B'. FIG. 4 illustrates how the bipolar junction transistors are integrated with the MOS Hall sensor. Basically, this is achieved by forming base regions 19 and 18 directly adjacent to the channel region 17 so that inversion layer 35 extends all the way to what normally is the base-collector junction of transistors 28 and 29.

In FIG. 4, p-type region 19, n+ region 21 and n-type substrate 27 form NPN transistor 28. NPN transistor 29 is formed by substrate 27, p-type base region 18 and n+ emitter region 22. As discussed above, when current $I_d$ flows across inversion layer 35, a Hall voltage is developed across the transverse portion of channel 17. The p-type inversion layer 35 extends completely across channel 17 where it makes ohmic connection to each of the p-type bases 18 and 19. Thus, the voltage $V_{Hall}$ developed in inversion layer 35 is ohmically coupled to base regions 18 and 19 of transistors 29 and 28, respectively.

It is appreciated that although the preferred embodiment utilizes a p-channel MOS device, the present invention could also be implemented using an n-channel MOS Hall senosr integrated with PNP emitter followers for sensing the $V_{Hall}$. As previously described, Hall sensor 10 could also be fabricated in a different substrate material, as a heterostructure device, or any other device or material which expresses the Hall effect.

Transistors 28 and 29 are configured as emitter followers to function as sensitive, high input impedance, low output impedance amplifiers. The Hall voltage, indicative of the data of information stored in patch 33, therefore appears across emitters 21 and 22 where it can be read by decoder circuitry coupled to lines 41 and 42. Lines 41 and 42 provide electrical contact to n+ emitter regions 22 and 21, respectively, and are shown labeled Bit and $\overline{Bit}$. In other words, when binary data is stored in patch 33, the voltages appearing on lines 41 and 42 have values corresponding to either a logical "1" or a logical "0".

According to the currently preferred BiCMOS process flow, lines 41 and 42 comprise second layer silicided polysilicon (poly 2) patterned into lines which contact each of the emitters within a column of an array. This poly 2 silicide is covered with a silicon nitride layer upon which the magnetic patch 33 is formed. Because, the fundamental operation of the invented memory cell is not overly sensitive to the exact placement of patch 33, it could also be formed directly over the poly 2 silicide lines 41 to 42 if the magnetic patch were implemented using a non-conductive magnetic material such as chromium dioxide.

Recognize that the magnetic semiconductor memory cell thus far described is entirely static and non-volatile. This means that information stored within patch 33 is retained indefinitely regardless of how many read cycles are performed. This obviates the need to refresh the memory periodically as is the case in conventional DRAM memories. Moreover, in addition to being static and non-volatile, the described memory cell is also capable of being manufactured to extremely small cell dimensions (typically on the order of 5 square microns per cell). Also, depending on certain design choices and methods of fabrication, the invented memory cell has unusually fast access times. Moreover, the invented memory cell is radiation hard—a feature which is particularly important for certain military applications.

To perform a read operation on a single memory cell located within an array, the following procedure is used. First, polysilicon gate member 24 is grounded to generate inversion layer 35 in the underlying channel 17. (In the case of an n-channel MOS Hall sensor, gate 24 is taken to a high positive potential such as $V_{CC}$). Most often, gate member 24 comprises a wordline coupled to a row of identical cells. Therefore, activating a wordline in the array forms an inversion layer in each of the memory cells located within that row.

As soon as the current $I_d$ begins to flow in channels 17, the voltage $V_{Hall}$ appears across each of the base regions 18 and 19. The polarity of the Hall voltage sensed across base regions 18 and 19 is, of course, dependent upon the polarity of magnetic patch 33. Hence, the data stored in patch 33 is translated to a voltage which is sensed by bipolar transistors 28 and 29. The voltages appearing on lines 41 and 42 are eventually decoded by column decoders associated with the array to access the magnetically stored information. Such decoder circuitry is well known in the field of semiconductor memories.

As is appreciated by practitioners in the art, transistors 28 and 29 not only provide current amplification, but also provide buffering of the Hall voltage between the memory cells connected along the shared bit lines within the array. In other words, the emitter followers function as both current amplifiers and as buffers. If the NPN transistors 28 and 29 were omitted from FIGS. 1 through 4 (e.g., if lines 41 and 42 were fabricated as buried bit lines to ohmically contact the transverse sides of channel region 17) then each cell would electrically short out the other during read operations. Accordingly, there is a need to isolate the Hall voltage produced in a single cell from all of the other cells in the memory array. Note that MOS or other pass transistors may be used to buffer the Hall voltage from the other memory cells as an alternative. But, the inclusion of pass transistors would tend to complicate the basic memory cell design and necessitate additional interconnects and control logic.

Another advantage of using bipolar transistors in an emitter follower configuration is that emitter followers typically have a very high impedance looking back into the emitter terminal. This is important because it is desired that the voltage $V_{Hall}$ have a high drive capability; that is, the emitter followers must provide a large amount of current and impedance transfer, since the bit lines themselves have a relatively large capacitance and are connected to Y-decoder circuitry.

In the normal emitter follower configuration, bit lines 41 and 42 are one base-emitter voltage drop ($V_{be}$) down from the voltage appearing on either side of the sensor. By way of example, if a positive voltage is sensed by base region 18 and a negative voltage sensed by base region 19, then line 41 would be approximately $V_{Hall}-0.7$ Volts. The magnitude of the difference between the voltages present on lines 41 and 42 is approximately equal to the voltage $V_{Hall}$.

Sensing and decoding of the information stored in patch 33 may also be accomplished in other ways. For instance, it is possible to leave gate 24 grounded at all times so that inversion layer 35 is continuously present. The power supply line coupled to either region 14 or 15 could then be pulsed momentarily to generate drive current $I_d$. Other variations, well within the skill of an ordinary practitioner in the art, are also possible.

Writing is performed, as discussed above, by flowing current along write lines 30 and 31 in such a way as to generate a magnetic field strong enough to force the magnetic particles in patch 33 to "flip" to the desired orientation. FIG. 2 shows a write current $I_W$ flowing along lines 30 and 31 in such a direction so as to cause patch 33 to be magnetized in a vertical direction, i.e., where the magnetic field 23 is directed out of the page. In the currently preferred process for fabrication of the memory cell, write lines 30 and 31 comprise metal 1 and metal 2 lines, respectively, and are formed at a planar level which is above that of semiconductor sensor 10 and magnetic patch 33.

The magnetic patch itself can be anywhere between 0.1 microns to several microns in thickness to generate a sufficiently strong magnetic field for read operations. Moreover, there is no strict requirement that patch 33 be placed in the same general plane as lines 30 and 31 since the magnetic flux lines generated by the current $I_W$ will extend far above and far below the metal 1 and metal 2 plane. Note that the write lines 30 and 31 are coupled only to the current drivers used to produce current $I_W$.

Figure 5:
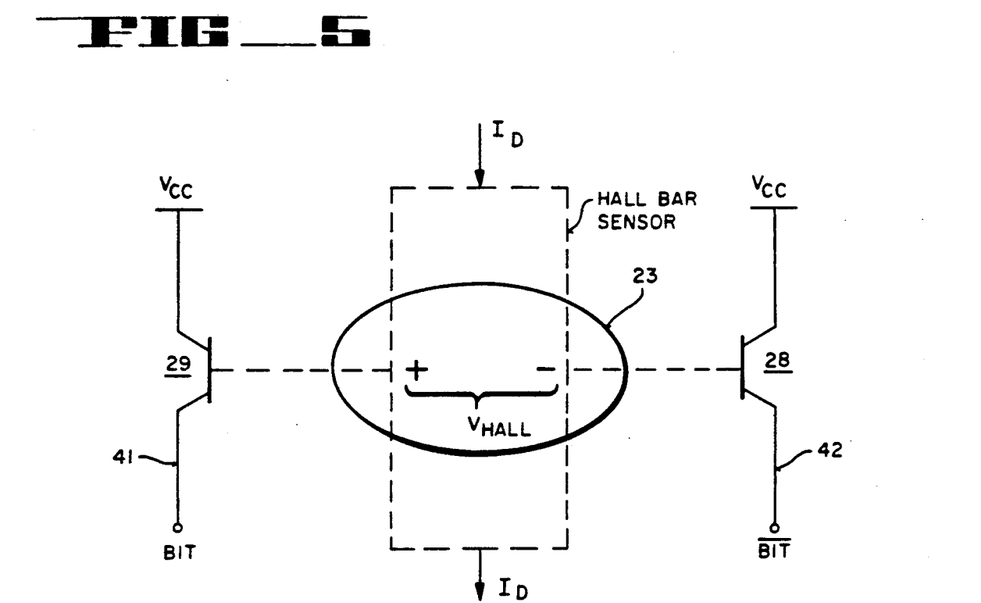
FIG. 5 shows an equivalent circuit schematic of the embodiments of FIGS. 3 and 4.

Referring to FIG. 5, an equivalent circuit of the basic memory cell of the present invention is shown. The circuit comprises a p-channel MOS Hall bar sensor along which current $I_d$ is directed perpendicular to a magnetic field 23. This generates a Hall voltage $V_{Hall}$ across the transverse width of the Hall bar. As previously described, the voltage $V_{HALL}$ is then ohmically coupled to the bases of transistors 29 and 28. The substrate 27 acts as a common collector for each of these transistors, and, in the emitter follower configuration, is coupled to the supply potential, $V_{CC}$ (e.g. 5 volts). The emitters of transistors 29 and 28 are coupled to Bit line 41 and $\overline{\text{Bit}}$ line 42, respectively.

When fabricated in an array consisting of rows and columns of cells, lines 41 and 42 are generally coupled to every emitter within a column of the memory array. At the bottom of the column, Bit lines 41 and $\overline{\text{Bit}}$ lines 42 are coupled to Y-decoder circuitry which decodes the stored information from the individual cells within the array. Since polysilicon gate 24 (see FIGS. 3 and 4) is normally implemented as a wordline, it forms the gate of each cell in a horizontal row across the array. To summarize, when an individual row within a memory array is selected by grounding the appropriate wordline, and current $I_d$ is applied to the particular cell to be read, the stored data appears on Bit line 41 while the complement of that data appears on $\overline{\text{Bit}}$ line 42.

Figure 6:
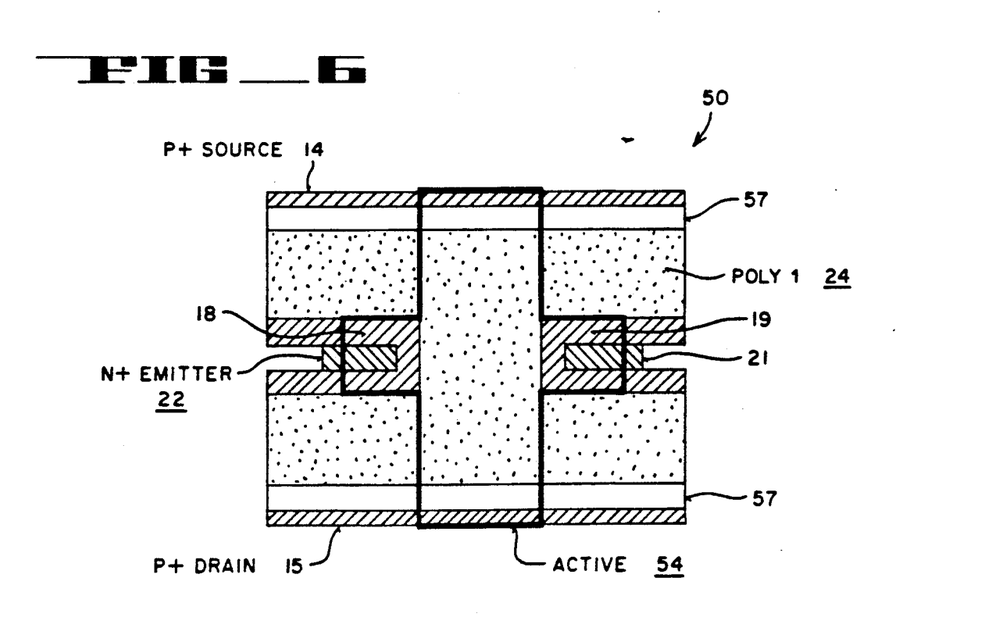
FIG. 6 illustrates a top view of the invented magnetic memory cell as fabricated according to the currently preferred BiCMOS process.

Referring to FIG. 6, a typical layout of a single memory cell 50 fabricated according to the currently preferred BiCMOS process is illustrated. The layout of memory cell 50 includes p+ source region 14 and p+ drain region 15. Both regions 14 and 15 are formed by diffusion of impurities from an overlying polysilicon layer, as described in the incorporated application. A first polysilicon layer is used as a diffusion source and as an electrical contact to regions 14 and 15. Polysilicon gate 24 comprises a wordline in the array and is shown separated from the source and drain regions 14 and 15 by spacer oxide 57. Spacer oxide 57 is used to electrically isolate polysilicon wordline 24 from the polysilicon members which contact source and drain regions 14 and 15. (The polysilicon members which contacts regions 14 and 15 are referred to as SDE polysilicon in the incorporated application).

The base regions for the integral NPN transistors are denoted as regions 18 and 19. The emitters for the respective NPN transistors are shown as regions 22 and 21. The active region for the memory cells is shown enclosed by the boundary line 54. Note that magnetic patch 33 is not depicted in FIG. 6 so that the full extent of polysilicon layer 24 may be shown clearly. In the actual implementation, magnetic patch 33 resides directly above the center of active region 54 (see FIG. 7).

To sense the data stored in the magnetic patch of the memory cell 50, poly 1 wordline 24 is first grounded. Next, a drive current $I_d$ is supplied by connecting an external voltage source across source/drain regions 14 and 15. This produces a current $I_d$ which flows through the channel region of the p-channel MOS Hall sensor. The transverse magnetic field 23 generates the voltage $V_{Hall}$ which is ohmically coupled to base regions 18 and 19. With the underlying n-type substrate electrically connected to $V_{CC}$, each of the NPN transistors amplifies the sensed voltage. The stored data may then be read from lines 41 and 42, coupled to the emitters of transistors 29 and 28, respectively. Lines 41 and 42 run vertically over memory cell 50 contacting the emitter regions 22 and 21, respectively (see FIG. 7). As described above, Bit and $\overline{Bit}$ lines 41 and 42 are formed in the currently preferred process using poly 2 silicide. Protecting and insulating this poly 2 silicide layer is a layer of silicon nitride. The magnetic material which forms patch 33 is usually patterned or deposited over a nitride layer.

Figure 7:
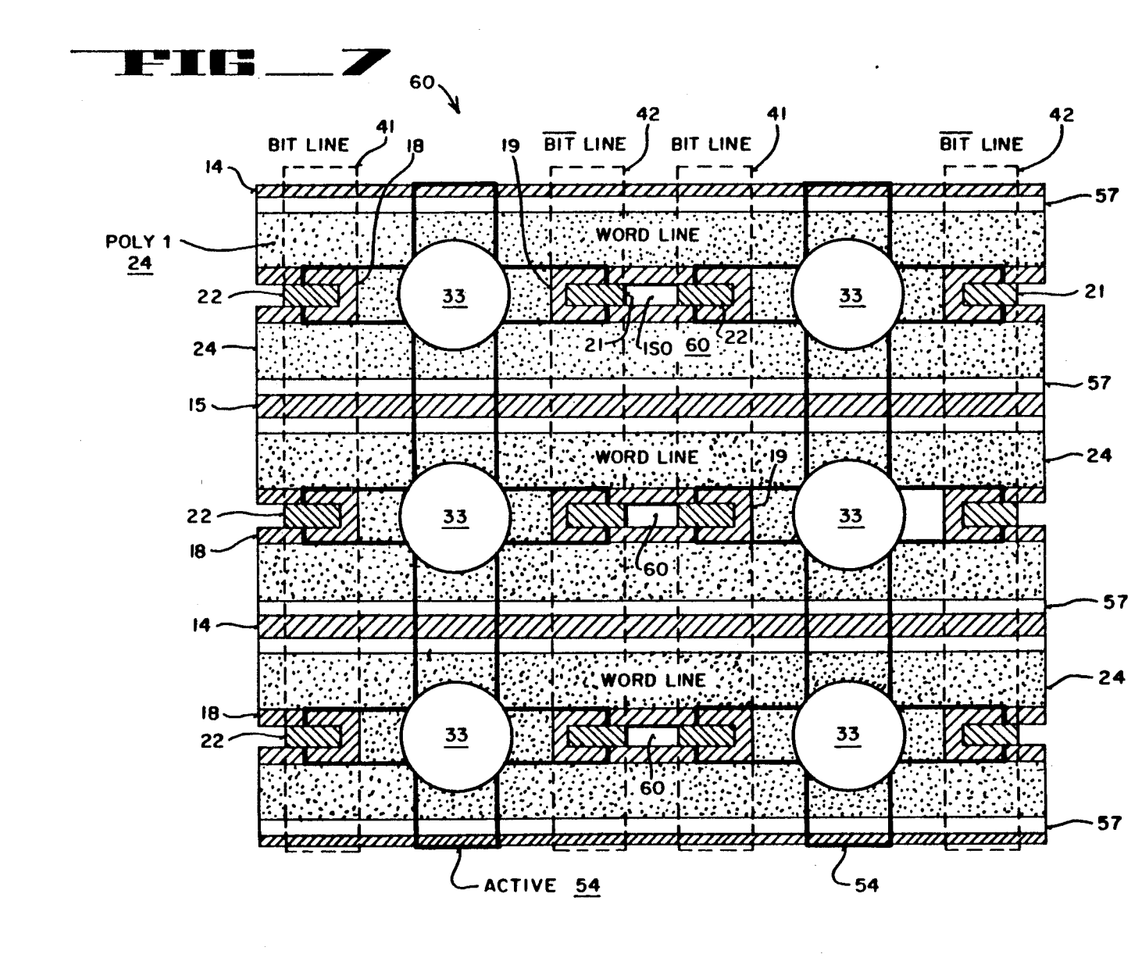
FIG. 7 shows a top view of an array of six magnetic memory cells. The illustration of FIG. 7 also includes the location of the magnetic patches, the bit lines and the wordlines.

FIG. 7 shows a simple array 60 of six memory cells, and includes the placement of magnetic patches 33, poly 2 silicide lines 41 and 42, and also poly 1 wordlines 24. Understand that the polysilicon layer which forms individual wordlines 24, also covers the entire active region in FIG. 7 (except, of course, the base/emitter regions of the transistors). This includes the area directly beneath magnetic patch 33. Bit and $\overline{Bit}$ lines 41 and 42 are shown by the dashed lines running vertically over memory array 60. These lines contact each emitter within an individual column of the array.

According to the embodiment of FIG. 7, individual emitters 21 and 22 are separated by an isolation region 60. Practitioners in the art will appreciate the overall density and simplicity which is realized by memory array 60. For instance, using the currently preferred method of fabrication individual cells may be formed in an area of approximately 5 square microns. The total area of the six cell array 60 is therefore about 30 square microns.

Figure 8:
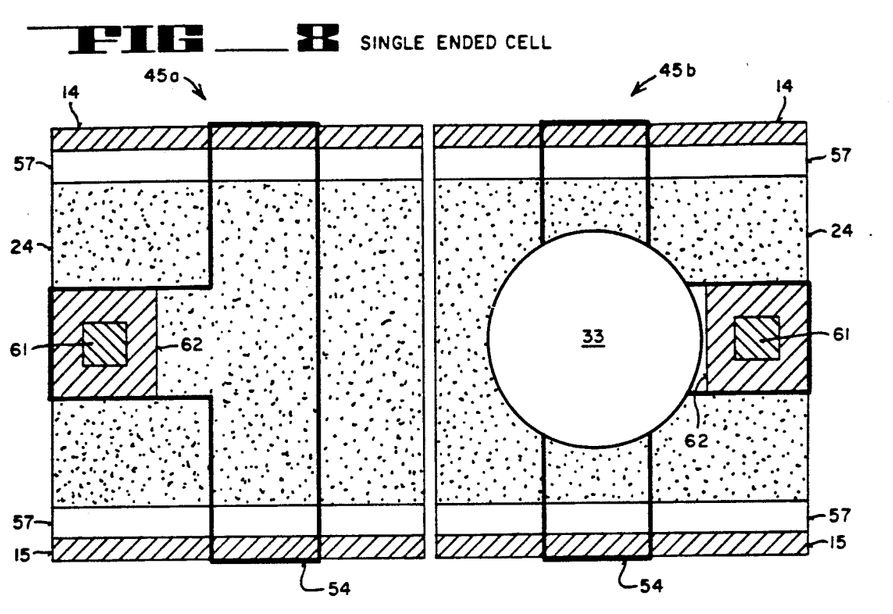
FIG. 8 shows an alternative embodiment of the basic magnetic semiconductor memory device as a single-ended cell.

FIG. 8 is provided to show that the present invention may be practiced using a single, rather than a differential-ended, Hall voltage sensor. Memory cells 45a and 45b show two possible configurations for a single-ended memory cell. Both cells include an emitter region 61 surrounded by base region 62. The active region 54 for each device is defined by boundary line 54. The remainder of the cell functions exactly as described above in FIGS. 1-7. That is, as a current $I_d$ is driven across the channel region of the p-channel MOS sensor, a transverse Hall voltage is developed across the channel which is ohmically coupled to base region 62 of the NPN transistor. Emitter 61 is connected to a vertical bit line, which, in the case of preferred embodiment, is formed of poly 2 silicide. (Magnetic patch 33 has been omitted from cell 45a in order to show the full extent of active region 54.)

Figure 9:
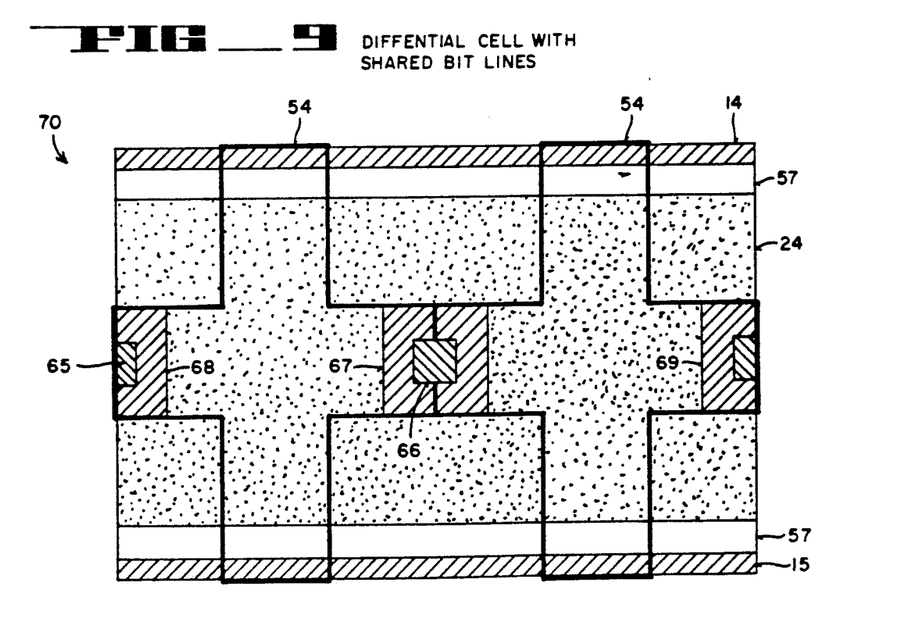
FIG. 9 shows an alternative embodiment of the basic magnetic semiconductor memory device as a differential cell employing shared bit lines.

Yet another alternative memory cell arrangement is shown in FIG. 9 to illustrate how a pair of differential cells 70 may be implemented within an array using shared bit lines. In the embodiment of FIG. 9, each cell includes a pair of associated bipolar emitter followers. The emitter and base regions of the first bipolar transistor are identified as regions 65 and 68, while the emitter and base regions of the second bipolar transistor are given as regions 66 and 67, respectively. The basic concept incorporated into the embodiment of FIG. 9 is that each emitter is shared by the adjacent memory cell. When fabricated as an array, a common poly 2 silicide line runs vertically over the pair 70 to contact emitter 66.

The main benefit realized by the embodiment of FIG. 9 is smaller cell size and consequently a denser memory array layout. Of course, the use of shared bit lines within a memory array requires that additional arithmetic be performed by the associated Y-decoder circuitry. For certain applications, however, the added complexity in the decoder circuitry may be outweighed by the advantage of reduced memory array size.

Figure 10:
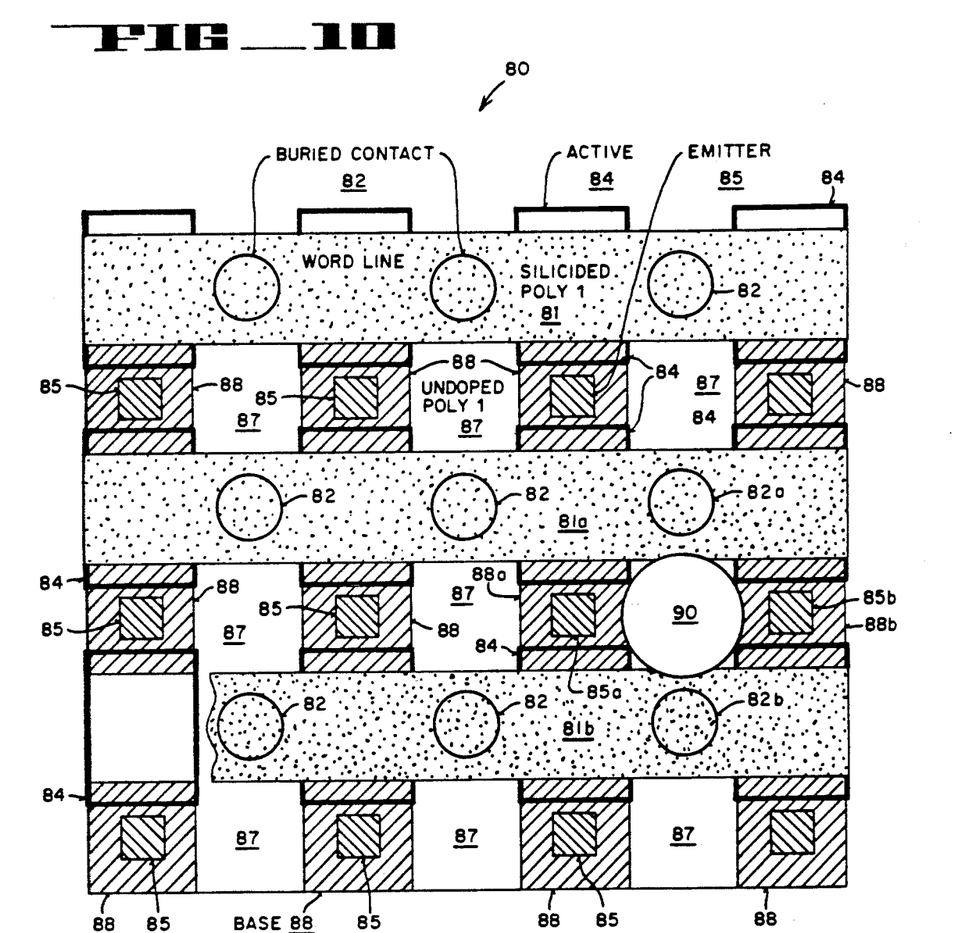
FIG. 10 shows an alternative embodiment of the present invention in which a minimum area magnetic semiconductor memory array is fabricated using the currently preferred BiCMOS process.

With reference now to FIG. 10, a memory array 80 is shown in which each memory cell occupies an area which is approximately 1 pitch × 1 pitch in total dimension (a pitch being the area occupied by a given minimum feature, e.g., metal plus the minimum spacing for that feature). In the currently preferred method of fabrication, one metal pitch is about one micron in width. Obviously, array 80 could easily be scaled to smaller dimensions with more advanced photolithographic techniques. Presently, it is contemplated that a 64 megabit non-volatile, static, random-access-memory (RAM) can be manufactured in an total area of less than one square centimeter. Thus, the embodiment of FIG. 10 represents an overall memory array density which has thus far been unachievable using conventional methods and practices.

In memory array 80, the emitters 85 and base regions 88 are fabricated using normal bipolar processing techniques as described above in connection with FIGS. 1-9. Note that a shared bit line scheme is employed so that emitters 85 are shared by adjacent cells. Active regions for the devices are defined by the boundary lines 84. These active regions are present everywhere except within the bounded rectangles formed by lines 84.

During the fabrication process of array 80, an opening is etched through a portion of the gate oxide directly below word lines 81. This opening extends completely down to the substrate surface thereby allowing electrical contact to the underlying silicon. Such contacts are commonly referred to as buried contacts and are shown in FIG. 10 by circles 82. After buried contacts 82 have been formed in the gate oxide, a layer of first polysilicon (poly 1) is deposited over the entire array. The poly 1 layer is patterned to completely cover the array except for base regions 88 and emitter regions 85. The poly 1 layer is moderately doped and makes ohmic contact through buried contacts 82 down to the underlying substrate.

Following the patterning of the first polysilicon layer, selective portions of it are silicided to form low resistance current paths. Silicided poly 1 regions are shown in FIG. 10 as regions 81. As is clearly seen, silicided poly 1 lines 81 are arranged along separate rows of memory array 80. The remaining portions of the poly 1 layer (those areas which have not been selectively silicided) are identified in FIG. 10 by region 87. Region 87 functions as the gate electrode for the MOS Hall sensor and is typically left undoped. Following patterning of the first polysilicon layer, a layer of silicon nitride is deposited over the array. The deposition and patterning of the magnetic media to form individual patches 90 follows.

Although only one patch 90 is shown in FIG. 10 for reasons of clarity, it is appreciated that patches 90 reside directly above undoped poly 1 region 87 for each individual cell. Also note that the bit lines used to access information stored in patch 90, as well as the write lines for writing data into patch 90, have not been shown in FIG. 10 also for clarity reasons.

In the preferred layout of FIG. 10, there are no spaced-apart p+ regions formed within the substrate which function as source/drain regions for the MOS sensor. This obviates the use of SDE polysilicon for making electrical contact to the source/drain regions. The only place that SDE polysilicon is used in the layout of FIG. 10 is for contacting emitters 85.

The manner in which the individual memory cells of array 80 are sensed, is as follows. First, one of the silicided poly 1 wordlines 81a (adjacent to the memory cell to be read) is raised to a high positive potential. The other adjacent silicided wordline 81b (i.e. on the opposite side of the cell to be read) is grounded. To prevent disturbance from other memory cells within the array, all of the wordlines 81 below the accessed cell are grounded while all of the wordlines 81 above the accessed cell are raised to the same high positive potential, e.g. 5 volts. In other words, the portion of the array above patch 90 (to be read) has its wordlines raised to a high potential while the portion of the array below the selected patch 90 has its wordlines grounded. This method of accessing a single cell within a memory array without disturbing the contents of adjacent cells is frequently referred to as "debiasing".

Due to the voltage gradient established between adjacent wordlines 81a and 81b, the buried contacts 82a and 82b effectively act as the drain and source terminals of the MOS Hall bar sensor. The voltage applied to line 81a is adjusted so as to be large enough to create an inversion layer in the channel region directly under undoped poly region 87. In certain processes this may require a small depletion implant to be introduced into the channel region, i.e. the sensor area, so as to ensure the formation of an inversion layer which extends completely across the channel. Thus, for each of the memory cells of FIG. 10, the gate, source contact and drain contact are all shared elements.

The Hall potential generated across the channel region is sensed by base regions 88a and 88b, coupled to emitters 85a and 85b, respectively. Emitters 85a and 85b are then coupled by their associated bit lines to appropriate Y-decoder circuitry.

Figure 11:
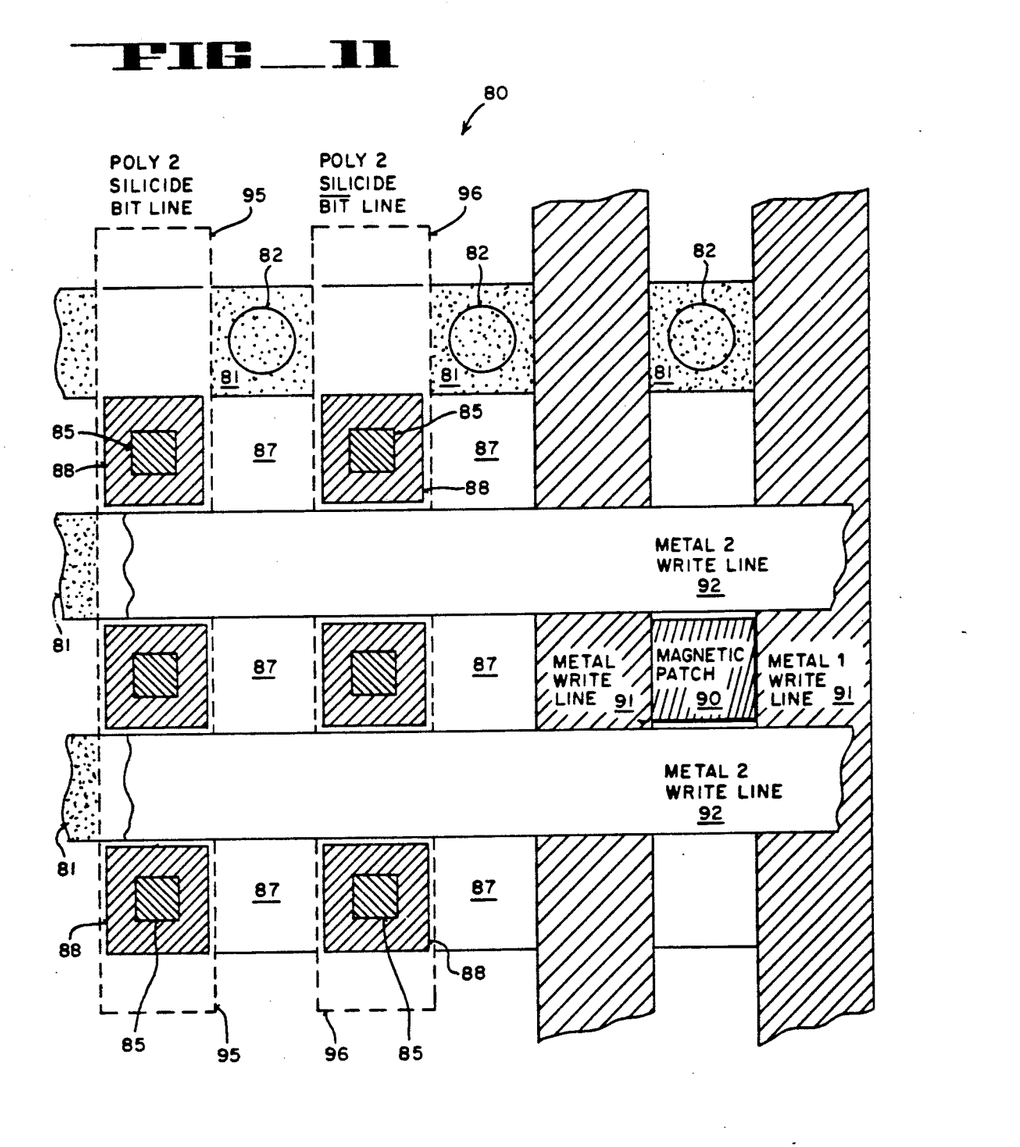
FIG. 11 illustrates the currently preferred embodiment of the present invention.

Referring now to FIG. 11, the currently preferred embodiment of memory array 80 is shown further including write lines 92 and 91 along with poly 2 silicided bit lines 95 and 96. As is apparent, poly 2 silicided lines 95 and 96 are fabricated above, and make contact with, each of the emitters 85 within a column of the array. Directly above, and insulated from bit lines 95 and 96, are metal 1 write lines 91. Running perpendicular to, and insulated above, lines 91 are metal 2 write lines 92. Lines 91 and 92 run horizontally across memory array 80. Note that in the embodiment of FIG. 11 magnetic patch 90 is shown patterned into the shape of a square. Also note that metal 2 write lines 92 are conveniently defined directly above poly 1 silicided lines 81.

Although up to this point the discussions and explanations of the present invention have primarily assumed storage of digital information (i.e., a binary 0 or a binary 1), it should be understood that the present invention is also capable of storing multiple data bits. When employed as an analog memory cell, certain domains of magnetic patch 90 are magnetized in one direction while others are magnetized in the opposite direction. As long as magnetic patch 90 is arranged such that multiple domains are present, then multiple bits may be stored and read from patch 90. In such a situation, an analog voltage would be used to write information into patch 90 and both the magnitude and polarity of the Hall voltage would be sensed to read data from the memory cell.

ALTERNATIVE METHODS OF READING AND WRITING DATA

Every magnetic material becomes non-magnetic when heated to a temperature high enough for thermo agitation to destroy the ordering of its molecules. The temperature at which this occurs is known as the Curie point temperature. The Curie temperature varies drastically depending upon the type of magnetic material. By way of example, most tape oxides typically have a Curie point of approximately 600 degrees C; permalloy core heads have a Curie temperature of approximately 400 degrees C; manganese bismuth alloy has a Curie point of approximately 300 degrees C; and chromium dioxide ($CrO_2$) has a Curie point temperature equal to 126 degrees C.

As described above, a patch is ordinarily magnetized by subjecting it to a strong magnetic field—developed by a set of surrounding write lines each carrying a robust current $I_W$. An alternative method of writing data involves heating the magnetic material above its Curie point temperature, then cooling it through its Curie point, at which time even a weak field will magnetize it strongly. In this situation, the magnitude of the current $I_W$ needed to magnetize the magnetic patches is substantially reduced as compared to normal room temperature writing.

Under special circumstances, this type of Curie point recording can be of advantage. For instance, Curie point heating is the principle employed in modern optical disk technology. Once the magnetic material is raised to its Curie point, it does not require much energy to flip the field of orientation of the magnetic material. By way of example, the magnetic patches in the memory array could be heated by placing a polysilicon resistor near each patch and then flowing sufficient current through the resistor to heat the magnetic material above its Curie temperture. Another example would be to force a current through a conductive magnetic patch, raising its temperature above its Curie point.

One application in which Curie point recording might be particularly useful is where an energy source—with sufficient energy to heat the magnetic material to its Curie point—is focused on the memory array 80 of FIG. 11. When used in this manner, memory array 80 operates as a type of receiver. It receives information in the form of electrical or optical energy, wherein bits of information are stored based on whether the incident radiation is great enough to heat a particular cell above its Curie point.

A useful application for such an array would be as an input device to an optical computer. For example, a 1K×1K array 80 could be initially biased to a +1 magnetic orientation with a −1 magnetic field then applied to the array using external means. An intense flash of energy representing the input information (e.g. provided by a focused electron beam or a laser) is then directed onto the array. In the case of a focused light source, the relatively bright regions would heat the magnetic patches above the Curie point, thereby flipping the orientation of the magnetic material from a +1 to a −1. In the relatively dark regions where the received energy is insufficient to raise the temperature of the patch above its Curie point, the previously encoded magnetic field would persist (e.g., +1). Thus, memory array 80 can function as a display input device which locks an optical image into a non-volatile static memory using Curie point recording.

For such an application, the present invention adds an entirely new dimension to semiconductor memories: that is, magnetic recording as well as Curie point recording, wherein data may be written and stored using optical means.

Another application of the present invention takes advantage of the Kerr magneto-optical effect. In the Kerr effect, light reflected off the surface of a magnetic material is optically polarized. The polarization angle of the electromagnetic radiation reflected from the surface of the magnetic material is a function of its magnetization. This polarization is the result of the interaction between the photons and the molecular order imposed by the magnetizing field. The stronger the magnetic field, the greater the molecular ordering and the more that the ordering influences the incident radiation. When the incident ray is already polarized and its plane and the magnetization vector both lie in the same plane, the reflected ray is also polarized. But now its main axis is rotated slightly. In all circumstances, the amount of rotation is a function of wavelength and the angle of incidence.

Taking advantage of the Kerr effect, a novel type of display device may be realized using the memory array 80 of FIG. 11. If memory array 80 is arranged such that all of the magnetic particles are visible from the top surface of the device, and an intense beam of light is reflected off of this surface, contrast will be developed between the stored bits (e.g. 1 or 0, corresponding to either light or dark patterns). When employed in this way, the memory array 80 functions as a spatial light modulator with memory. Of course, the memory array is non-volatile so that once the array has been written, the display memory is the actual image recorded. According to the currently preferred embodiment of the present invention, a 4K×4K display would be capable of producing a cinema quality (i.e. state of the art) display. Of course, gray scale information may be implemented with analog magnetic memory cells, whereas color infomation would require three separate planes of memory devices.

The same type of memory display device described in the foregoing may also be implemented using the Faraday effect. In the Faraday effect, the incident light must pass through the magnetic material as opposed to being reflected off of it. Therefore, the memory device must be transparent to the wavelength of the light. This, however, poses no difficulty since transparency is a common characteristic of many magnetic garnets. Furthermore, silicon is transparent to infrared light while gallium phosphide (GaP) is transparent to ordinary white light. Silicon-on-sapphire also has desirable transparency properties.

Once light is passed through the magnetic material (according to the Faraday effect), or is reflected off of the surface of the magnetic material (according to the Kerr effect), it is simply analyzed with a polarizer to determine the value of the individual bits of data within the array.

Whereas many alterations and modifications of the present invention will no doubt become apparent to a person of ordinary skill of the art after having read the foregoing description, it is to be understood that the particular embodiments shown and described by way of illustration are in no way intended to be considered limiting. For example, although this disclosure has shown a particular way of fabricating a Hall sensor with integral transistors NPN transistors, other implementations are possible. For instance, the present invention may be implemented using an n-channel Hall sensor or by creating a two-dimensional electron gas at a heterojunction. Therefore, reference to the details to the preferred embodiment are not intended to limit the scope of the claims, which themselves recite only those features regarded as essential to the invention.

Thus, a Hall effect semiconductor memory cell including an integral solid-state sensor has been described.

I claim:

1. In a process for fabricating a Hall effect semiconductor memory cell for storing information in a magnetic patch disposed above the surface of a semiconductor substrate, said patch storing information in the form of a magnetic field, a method of writing information to said memory cell comprising the steps of:
   (a) heating said patch above its characteristic Curie point temperature;
   (b) applying an electromagnetic field to magnetically orient said patch in a certain direction, said electromagnetic field being sufficiently strong to change the orientation of said patch when said patch is heated above its Curie point but being insufficient to change said orientation whenever said patch is at a temperature below its Curie point.

2. The method of claim 1 wherein step (b) comprises the step of flowing a first current through a first conductor and a second current through a second conductor, said first and second conductors being arranged on opposite sides of said patch and parallel to one another, said first and second currents flowing in opposite directions.

3. A method of fabricating a Hall effect semiconductor memory array comprising the steps of:
   providing a silicon substrate of one conductivity type;
   forming rows of wordlines used to generate an inversion layer in certain channel regions of said substrate, said wordlines being disposed above and insulated from said substrate except for a plurality of buried contacts connecting to said substrate along opposite ends of said channel regions;
   forming base regions of an opposite conductivity type on adjacent sides of said channel regions, said base regions being coupled to said inversion layer;
   forming emitter regions of said one conductivity type in said substrate to form a junction with said base regions;
   selectively siliciding said wordlines to form first and second low resistance lines over said buried contacts such that whenever a predetermined potential is applied across said first and second low resistance lines, a voltage gradient is established across said channel regions and across said wordlines, said voltage gradient being sufficiently large to produce said inversion layer in said substrate thereby allowing a current to flow across said channel regions;

forming a magnetic patch above said channel regions for storing data in the form of the magnetic field in a direction perpendicular to said current flow, said magnetic field producing a Hall voltage across said inversion layer having a polarity which is indicative of the data stored in said patch.

4. A method of writing information to the memory cell of claim 3 comprising the steps of:
   (a) heating said patch above its characteristic Curie point temperature;
   (b) applying an electromagnetic field to magnetically orient said patch in a certain direction, said electromagnetic field being sufficiently strong to change the orientation of said patch when said patch is heated above its Curie point but being insufficient to change said orientation whenever said patch is at a temperature below its Curie point.

5. A method of writing information to each memory cell of claim 3 comprising the steps of:
   (a) heating said patch above its characteristic Curie point temperature;
   (b) applying an electromagnetic field to magnetically orient said patch in a certain direction, said electromagnetic field being sufficiently strong to change the orientation of said patch when said patch is heated above its Curie point but being insuffficient to change said orientation whenever said patch is at a temperature below its Curie point.

6. The method of claim 3 wherein said wordlines comprise polysilicon.

7. A method of fabricating a Hall effect semiconductor memory device comprising the steps of:
   providing a substrate of one conductivity type;
   forming source and drain regions of an opposite conductivity type in said substrate, said source and drain regions being used to develop a current flow through a channel region defined therebetween;
   forming a gate member above said channel region, said gate member being used to generate an inversion layer in said channel region of said substrate;
   forming base regions of said opposite conductivity type on adjacent sides of said channel region, said base regions being electrically coupled to said inversion layer;
   forming emitter regions of said one conductivity type in said substrate to form bipolar transistors with said base regions and said substrate, said bipolar transistors being used to sense a Hall voltage generated across said inversion layer to read data stored therein; and
   forming a magnetic patch above said gate member for storing data in the form of the magnetic field in a direction perpendicular to said current flow, said magnetic field producing said Hall voltage across said inversion layer, said Hall voltage having a polarity which is indicative of the data stored in said patch.

8. The method of claim 7 wherein said gate member comprises polysilicon.

9. The method of claim 8 wherein said first conductivity type is n-type.

* * * * *